(12) United States Patent
Ohsumi

(10) Patent No.: US 7,358,608 B2
(45) Date of Patent: Apr. 15, 2008

(54) SEMICONDUCTOR DEVICE HAVING CHIP SIZE PACKAGE WITH IMPROVED STRENGTH

(75) Inventor: Takashi Ohsumi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/866,189

(22) Filed: Jun. 14, 2004

(65) Prior Publication Data

US 2005/0012210 A1    Jan. 20, 2005

(30) Foreign Application Priority Data

Jun. 13, 2003    (JP) .............................. 2003/169013

(51) Int. Cl.
*H01L 23/48* (2006.01)

(52) U.S. Cl. ................... 257/737; 257/779; 257/780; 257/E23.021

(58) Field of Classification Search ............. 257/737, 257/738, 690–700, 773–781; 438/613, 614, 438/615, 617

See application file for complete search history.

(56) References Cited

U.S. PATENT DOCUMENTS

| 5,291,374 | A  | * | 3/1994 | Hirata et al. ............... 361/760 |
| 6,287,893 | B1 | * | 9/2001 | Elenius et al. .............. 438/108 |
| 6,518,092 | B2 | * | 2/2003 | Kikuchi ..................... 438/107 |
| 6,555,415 | B2 | * | 4/2003 | Hedler ....................... 438/108 |

FOREIGN PATENT DOCUMENTS

| JP | O9107048 |   | 4/1997 |
| JP | 2002-93945 |   | 3/2002 |
| JP | 2002-093948 |   | 3/2002 |
| JP | 2002093945 A | * | 3/2002 |
| JP | 2004228236 |   | 8/2004 |
| WO | WO-9832170 |   | 7/1998 |

* cited by examiner

*Primary Examiner*—Marcos D. Pizarro
(74) *Attorney, Agent, or Firm*—Rabin & Berdo, PC

(57) ABSTRACT

The present invention provides a semiconductor device wherein a passivation film, an insulating film and an encapsulating layer are formed, in this order, on the surface of a semiconductor substrate, which is provided with a electrode pad thereon, and a leading end portion of a bump electrode supported by the insulating film and electrically connected to the electrode pad is exposed from the surface of the encapsulating layer. In the semiconductor device, a slit-shaped opening, which extends along a peripheral edge of the bottom of the bump electrode, is defined in the insulating film.

2 Claims, 4 Drawing Sheets

SEMICONDUCTOR DEVICE HAVING CHIP SIZE PACKAGE WITH IMPROVED STRENGTH

BACKGROUND OF THE INVENTION

1. Field of the Invention

The present invention relates to a semiconductor device with a chip size package (hereinafter called "CSP: Chip Size (Scale) Package") structure.

This application is a counterpart of Japanese patent application, Serial Number 169013/2003, filed Jun. 13, the subject matter of which is incorporated herein by reference.

2. Description of the Related Art

With a demand for downscaling of electronic equipment, miniaturization/densification of a semiconductor device has been made in recent years. Therefore, a semiconductor device having a CSP structure has been proposed wherein the shape of the semiconductor device is brought closer to a semiconductor element (chip) to reduce its size.

The semiconductor device having the CSP structure needs to increase the density of an array of external electrode terminals. Therefore, bump terminals (hereinafter called "bump electrodes") are used which are electrically connected to their corresponding electrode pads as the external electrode terminals and extend vertically from a chip surface.

A general structure of this type of semiconductor device is shown in FIG. 4. In the same drawing, reference numeral 401 indicates a semiconductor substrate formed with an integrated circuit, reference numeral 402 indicates a electrode pad, reference numeral 403 indicates a passivation film, reference numeral 404 indicates an insulating film having an electrical insulating property similar to the passivation film 403, reference numeral 406 indicates a bump electrode, reference numeral 405 indicates a wiring between the electrode pad 402 and the bump electrode 406, reference numeral 407 indicates an encapsulating resin layer, and reference numeral 408 indicates an external terminal made up of solder for connection to the outside.

As a material for the insulating film 404, for example, polyimide relatively high in elasticity is used to relax stress applied to the external terminal 408 and the bump electrode 406 and prevent the occurrence of cracks in a semiconductor integrated circuit containing the passivation film 403 and the electrode pad 402. The thickness of the insulating film ranges from approximately 0.005 to 0.01 mm.

In order to reduce stress applied to the electrode pad 402, such layout design that the bump electrode 406 is formed at a position where it does not overlap with an opening (corresponding to a portion in which the insulating film 404 located directly above the electrode pad 402 does not exist) defined in the insulating film 404 when viewed from above is performed. The size of the opening defined in the insulating film 404 ranges from approximately 0.02 to 0.06 mm in diameter, and the size of the bump electrode 406 ranges from approximately 0.15 to 0.4 mm in diameter. This type of semiconductor device has been described in, for example, a patent document 1 (Japanese Laid Open Patent Application No. 2002-93945).

SUMMARY OF THE INVENTION

With the structure referred to above, the stress is sufficiently relaxed even if the stress is applied to the bump electrode 406, so that the electrode pad 402, the passivation film 403 and the integrated circuit can be protected from the occurrence of the cracks. There was, however, a case in which even in the above structure, a portion to which a force greater than or equal to the limit of a tensile strength was applied, e.g., a electrode pad, a passivation film or wiring of an integrated circuit located therebelow would break when shear stress was applied to a portion below the bump electrode 406 to cause lateral displacements in the respective portions.

The present invention has been made in view of the foregoing problem. An object of the present invention is to protect a semiconductor device having a CSP structure from both stress applied to a bump electrode and shear stress applied to a portion below the bump electrode.

According to one aspect of the present invention, for achieving the above object, there is provided a semiconductor device, comprising:
 a passivation film;
 an insulating film;
 an encapsulating layer;
 the passivation film, the insulating film and the encapsulating layer being formed, in this order, on the surface of a semiconductor substrate provided with at least one electrode pad;
 a bump electrode supported by the insulating film and electrically connected to the electrode pad, the bump electrode having a leading end portion exposed from the surface of the encapsulating layer; and
 a slit-shaped opening defined in the insulating film so as to extend along a peripheral edge of the bottom of the bump electrode.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

First Embodiment

Figure 1A:
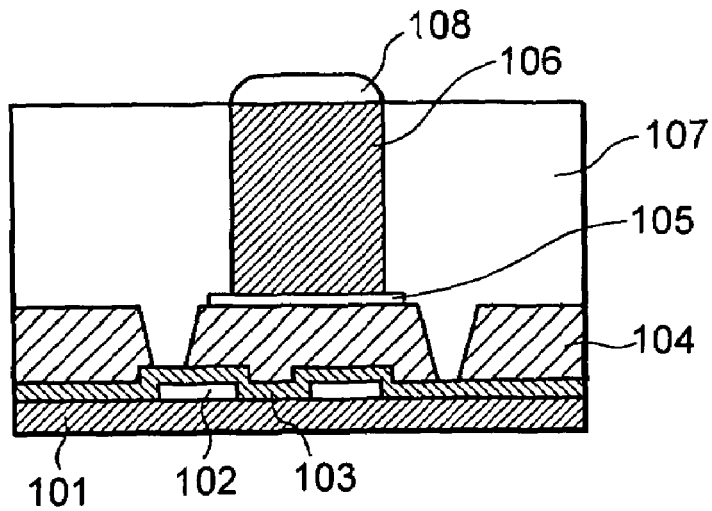
FIGS. 1a-1c are cross-sectional views and a top view showing a structure of a semiconductor device having a CSP structure, according to a first embodiment of the present invention.

A sectional structure of a semiconductor device having a CSP structure, according to a first embodiment of the present invention is shown in FIG. 1(a). In the same drawing, reference numeral 101 indicates a semiconductor substrate formed with an integrated circuit, reference numeral 102 indicates a electrode pad, reference numeral 103 indicates a passivation film, reference numeral 104 indicates an insulating film, reference numeral 106 indicates a bump electrode, reference numeral 105 indicates a wiring between the electrode pad 102 and the bump electrode 106, reference numeral 107 indicates an encapsulating resin layer, and reference numeral 108 indicates an external terminal constituted of solder for electrically electrode the semiconductor device to its corresponding substrate, respectively.

Figure 1B:
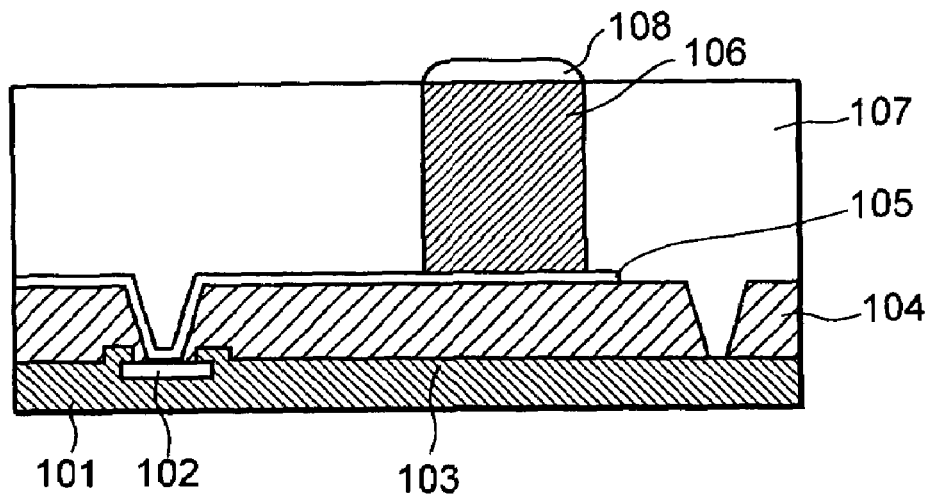
Figure 1C:
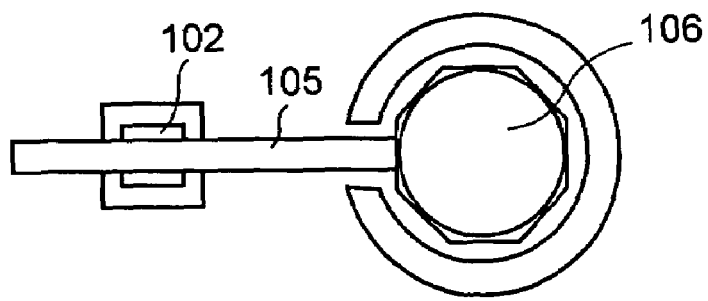

A sectional structure as viewed from the direction normal to FIG. 1(a) is shown in FIG. 1(b). A top view of the structure is shown in FIG. 1(c). As shown in these drawings, the present embodiment is characterized in that a slit-shaped opening extending along a peripheral edge of the bottom of the bump electrode is defined in the insulating film 104 that supports the bump electrode 106.

Since the slit extending along a peripheral edge portion of the bump electrode 106 is defined in the insulating film 104 although stress concentrates on the peripheral edge portion of the bump electrode 106, an inner portion surrounded by the slit, of the insulating film 104 made up of a material relatively high in elasticity such as polyimide is easily elastically deformed when the stress occurs in the peripheral edge portion, so that the stress concentrated on the peripheral edge portion of the bump electrode 106 is relaxed, thereby making it possible to protect the passivation film 103, the electrode pad 102 and the integrated circuit section placed below the bump electrode 106 from the occurrence of cracks. Since the encapsulating resin layer 107 is formed up to the height of a leading end of the bump electrode 106, the motion of the leading end portion of the bump electrode 106 is suppressed, whereas its basal portion becomes easy to relatively move as described above, thereby bringing about a further increase in the effect of stress relaxation.

Figure 1D:
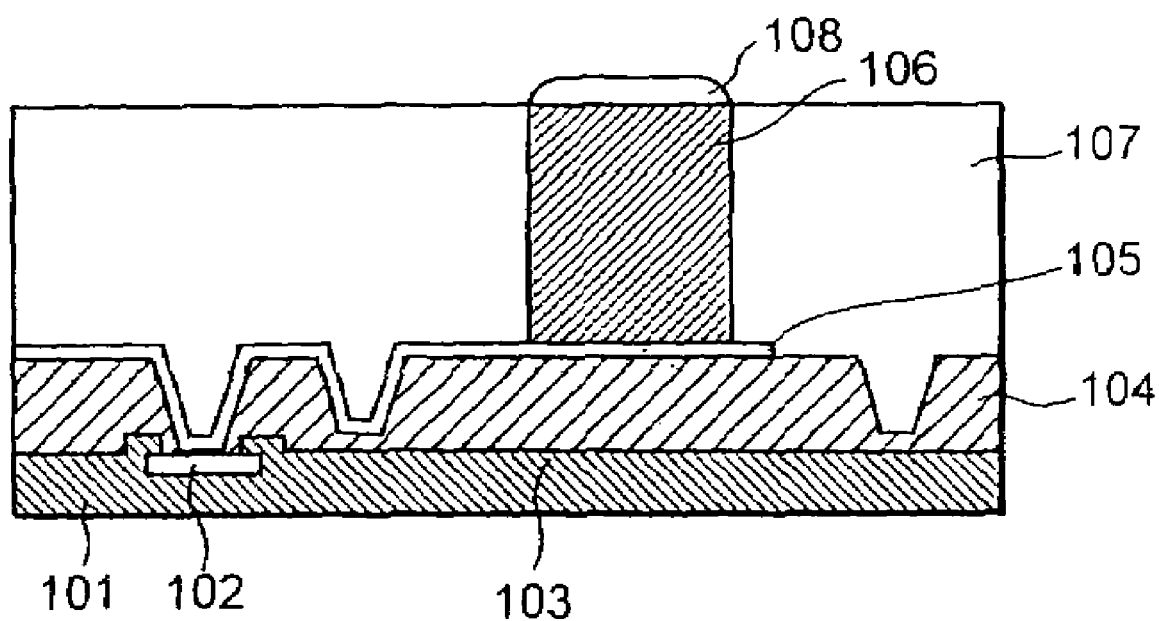
FIG. 1d is a cross-sectional view corresponding to FIG. 1b, but showing a modification thereof.

Incidentally, as shown in FIGS. 1(b) and 1(c), the wiring 105 is drawn out to the electrode pad 102 via a portion where no slit is formed in the insulating film 104. However, the slit is formed along the full circumference of the bump electrode 106, and the wiring 105 may be drawn to the electrode pad 102 via the bottom face of the slit. Incidentally, the slit may be formed to such a depth that the passivation film 103 is not exposed. Such a modification is illustrated in FIG. 1d, which corresponds generally to the view shown in FIG. 1b and which shows a slit that extends around the full circumference of bump electrode 106 without exposing the passivation film 103.

Since the effect of relaxing the stress produced due to the elastic deformation of the insulating film 104 becomes low when the distance from the peripheral edge of the bump electrode 106 to the slit, alignment accuracy or registration at the fabrication of the semiconductor device may preferably be set to such a degree that the distance can fall within 10 μm.

Second Embodiment

Figure 2:
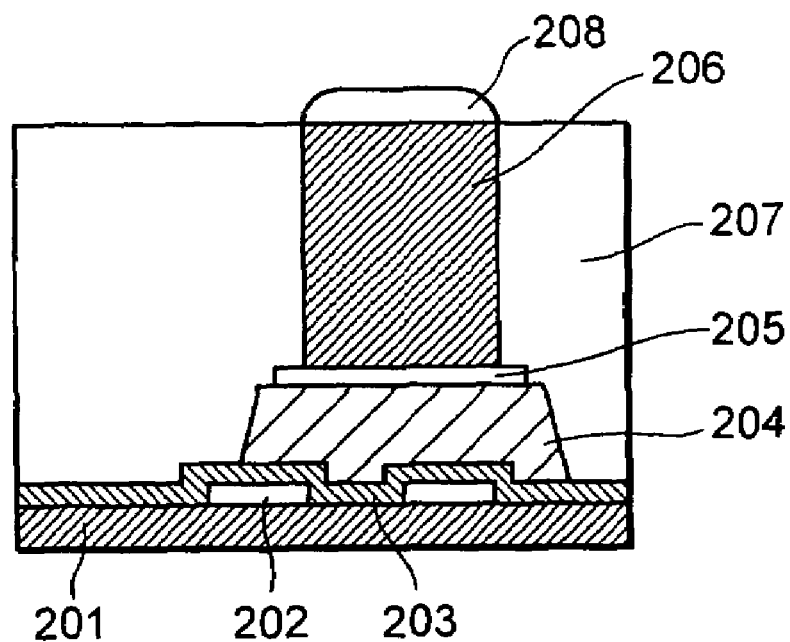
FIG. 2 is a cross-sectional view illustrating a structure of a semiconductor device having a CSP structure, according to a second embodiment of the present invention.

A sectional structure of a semiconductor device having a CSP structure, according to a second embodiment of the present invention is shown in FIG. 2. In the same drawing, reference numeral 201 indicates a semiconductor substrate formed with an integrated circuit, reference numeral 202 indicates a electrode pad, reference numeral 203 indicates a passivation film, reference numeral 204 indicates an insulating film, reference numeral 206 indicates a bump electrode, reference numeral 205 indicates a wiring between the electrode pad 202 and the bump electrode 206, reference numeral 207 indicates an encapsulating resin layer, and reference numeral 208 indicates an external terminal made up of solder for electrically electrode the semiconductor device to its corresponding substrate, respectively.

The present embodiment is a modification of the first embodiment and is configured as a structure wherein a portion located outside a slit-shaped opening of the insulating film 204 is eliminated. Even in the case of the present embodiment, a portion of the insulating film 204, which supports the bump electrode 206, is easily elastically deformed when stress occurs in a peripheral edge portion of the bump electrode 206, so that the stress concentrated on the peripheral edge portion of the bump electrode 206 is relaxed, thereby making it possible to protect the passivation film 203, the electrode pad 202 and the integrated circuit section disposed below the bump electrode 206 from the occurrence of cracks. Since the encapsulating resin layer 207 is formed up to the height of a leading end of the bump electrode 206 in a manner similar to the first embodiment, the motion of the leading edge portion of the bump electrode 206 is suppressed, whereas its basal portion becomes easy to relatively move as described above, thereby bringing about a further increase in the effect of stress relaxation.

Third Embodiment

Figure 3:
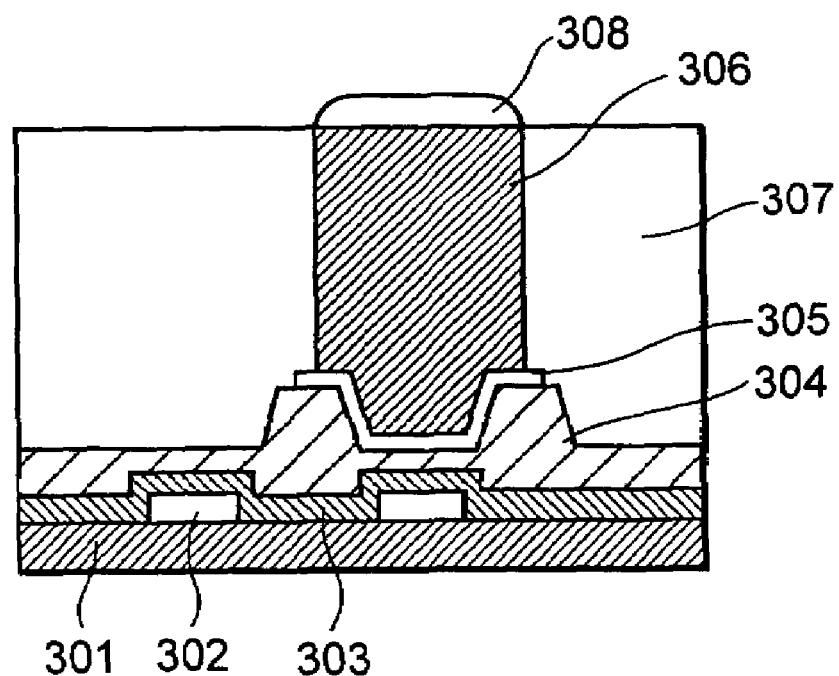
FIG. 3 is a cross-sectional view depicting structure of a semiconductor device having a CSP structure, according to a third embodiment of the present invention.
Figure 4:
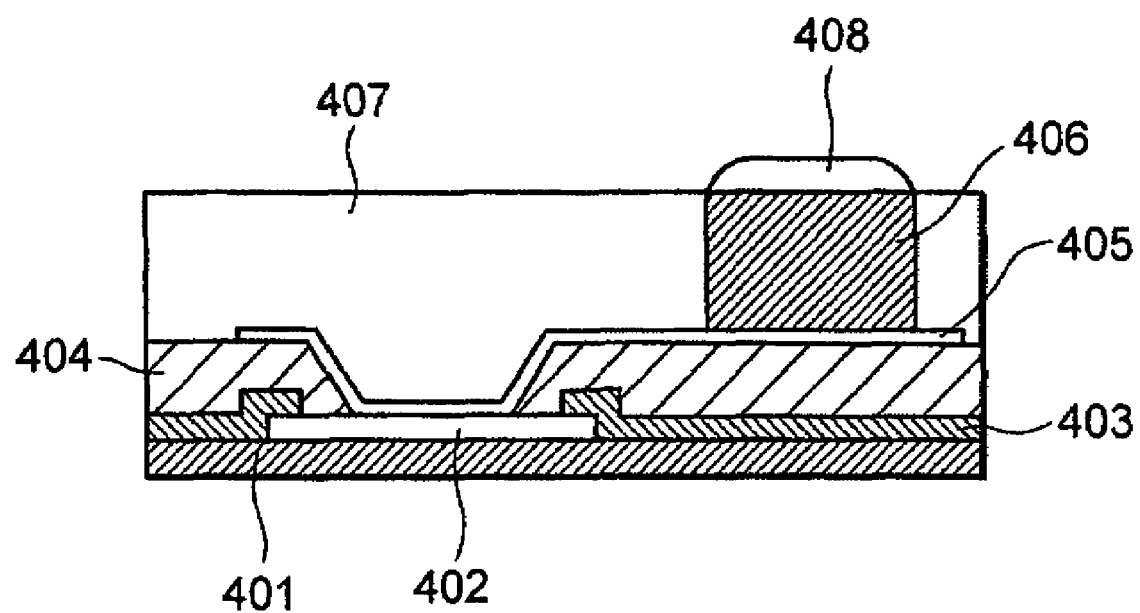
FIG. 4 is a cross-sectional view showing a structure of a semiconductor device having a conventional CSP structure.

A sectional structure of a semiconductor device having a CSP structure, according to a third embodiment of the present invention is shown in FIG. 3. In the same drawing, reference numeral 301 indicates a semiconductor substrate formed with an integrated circuit, reference numeral 302 indicates a electrode pad, reference numeral 303 indicates a passivation film, reference numeral 304 indicates an insulating film, reference numeral 306 indicates a bump electrode, reference numeral 305 indicates a wiring between the electrode pad 302 and the bump electrode 306, reference numeral 307 indicates an encapsulating resin layer, and reference numeral 308 indicates an external terminal made up of solder for electrically electrode the semiconductor device to its corresponding substrate, respectively.

The present embodiment is characterized in that the thickness of the insulating film 304 is set thick as compared with others at a portion directly below and in the neighborhood of a peripheral edge portion of the bump electrode 306. In the structure of the present embodiment, stress developed in the peripheral edge portion of the bump electrode 306 is sufficiently relaxed owing to synergy between elastic deformation of each convex portion (wall-thick portion) of the insulating film 304 and its thickness, so that the passivation film 303, the electrode pad 302 and the integrated circuit section disposed therebelow can be protected from the occurrence of cracks. Since the encapsulating resin layer 307 is formed up to the height of a leading end of the bump electrode 306 in a manner similar to the first and second embodiments, the motion of the leading end portion of the bump electrode 306 is suppressed, whereas its basal portion becomes easy to relatively move as described above. Therefore, the effect of relaxing the stress becomes greater.

Even in the case of any of the first through third embodiments of the present invention described above, the semiconductor device having the CSP structure can be protected from the occurrence of the cracks caused by the stress applied to the bump electrode upon packaging the semiconductor device to the substrate. Even when shear stress is applied to the substrate prior to its packaging to the substrate, the semiconductor device can be protected from the occurrence of the cracks.

The first and second embodiments make it easy to form the insulating film and can be manufactured at low cost. Since it is necessary to form each convex portion in the insulating film after the formation of the insulating film in flat form or grind the periphery of the convex portion by a dry etching method or the like after the thick insulating film has been formed in a flat fashion, the third embodiment becomes complicated in manufacturing process and high in cost as compared with the first and second embodiments.

However, the third embodiment can obtain a more excellent protection effect because the concentration of stress on the peripheral edge portion of the bump electrode can be relaxed owing to both effects of the thickness of the convex portion and its elastic deformation.

Incidentally, the CSP structure to which the present invention is applied, may be formed in a unitary PKG level or formed in a wafer level. Although the bump electrode is generally formed of a metal material such as copper, it may be formed of a conductive polymeric material. Also the bump electrode may be constituted as a structure in which a nonconductor resin surface is coated with a conductive material.

According to the present invention, the semiconductor device having the CSP structure can be protected from both the stress applied to the bump electrode and the shear stress applied to the lower portion of the bump electrode.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device comprising:

a passivation film;

an insulating film;

an encapsulating layer;

said passivation film, said insulating film and said encapsulating layer being formed, in this order, on the surface of a semiconductor substrate provided with at least one electrode pad;

a bump electrode supported by the insulating film and electrically connected to the electrode pad, said bump electrode having a leading end portion exposed from the surface of the encapsulating layer; and a slit-shaped opening defined in the insulating film so as to extend along a peripheral edge of the bottom of the bump electrode, said slit-shaped opening being covered by said encapsulating layer, wherein the slit-shaped opening is formed to such a depth that the passivation film is not exposed.

2. A semiconductor device comprising:

a passivation film;

an insulating film;

an encapsulating layer;

said passivation film, said insulating film and said encapsulating layer being formed, in this order, on the surface of a semiconductor substrate provided with at least one electrode pad;

a bump electrode supported by the insulating film and electrically connected to the electrode pad, said bump electrode having a leading end portion exposed from the surface of the encapsulating layer; and a slit-shaped opening defined in the insulating film so as to extend along a peripheral edge of the bottom of the bump electrode, said slit-shaped opening being covered by said encapsulating layer, wherein the slit-shaped opening is formed so as to extend along an overall length of the peripheral edge of the bottom of the bump electrode, and wherein the slit-shaped opening is formed to such a depth that the passivation film is not exposed.

* * * * *